United States Patent [19]
O'Keeffe

[11] 3,832,561
[45] Aug. 27, 1974

[54] METHOD AND APPARATUS FOR ELECTRON BEAM ALIGNMENT WITH A SUBSTRATE BY SCHOTTKY BARRIER CONTACTS

[75] Inventor: Terence W. O'Keeffe, Pittsburgh, Pa.

[73] Assignee: Westinghouse Electric Corporation, Pittsburgh, Pa.

[22] Filed: Oct. 1, 1973

[21] Appl. No.: 402,239

[52] U.S. Cl........... 250/492, 219/121 EB, 250/397, 313/65 AB, 315/3, 315/10, 315/31 R
[51] Int. Cl........................................... H01j 37/26
[58] Field of Search.......... 315/3, 4, 5.24, 10, 31 R; 313/65 T, 65 AB, 80, DIG. 7; 324/71 EB, 121; 250/397, 492 A; 219/121 EB

[56] References Cited

UNITED STATES PATENTS

| | | | |
|---|---|---|---|
| 3,326,176 | 6/1967 | Sibley | 219/121 EB X |
| 3,519,788 | 7/1970 | Hatzakis | 250/492 A |
| 3,543,079 | 11/1970 | Uno et al. | 315/3 |
| 3,693,013 | 9/1972 | Dueker | 313/65 AB |
| 3,699,304 | 10/1972 | Baldwin, Jr. | 250/492 A |
| 3,745,358 | 7/1973 | Firtz et al. | 250/492 A |

OTHER PUBLICATIONS

"Automatic Pattern Positioning of Scanning Electron Beam Exposure" by Russ et al., IEEE Transactions on Electron Devices, Vol. Ed-17, No. 6, June 1970, pps. 450-457.

*Primary Examiner*—James W. Lawrence
*Assistant Examiner*—Saxfield Chatmon, Jr.
*Attorney, Agent, or Firm*—C. L. Menzemer

[57] ABSTRACT

A method and apparatus are provided for precision alignment of an electron beam with selected areas of a major surface of a substrate. At least one and preferably two spaced apart detector marks of predetermined shape formed by Schottky barrier contacts are provided adjacent the major surface of the substrate. To align, an electron beam to be aligned has at least one alignment beam portion corresponding to at least one Schottky barrier contact detector mark and of predetermined cross-sectional shape. The electron beam is projected onto the major surface with the alignment beam portions thereof in the vicinity of corresponding Schottky barrier detector marks. An electrical signal is produced by each irradiated Schottky barrier contact corresponding to the area of the detector mark irradiated by an alignment beam portion. The electron beam is moved relative to the substrate to vary the electrical signal and is positioned where the electrical signal indicates optimum alignment of each alignment beam portion with a corresponding Schottky barrier detector mark. The method and apparatus is particularly suited for use in producing a very accurate component pattern in an electroresist layer on the major surface of the substrate with a patterned electron beam generated by a photocathode source.

21 Claims, 10 Drawing Figures

METHOD AND APPARATUS FOR ELECTRON BEAM ALIGNMENT WITH A SUBSTRATE BY SCHOTTKY BARRIER CONTACTS

GOVERNMENT CONTRACT

This invention is made in the course of or under Government Contract F 30602-69-C-0280.

RELATED APPLICATION

This application is a continuation-in-part of copending application Ser. No. 370,489, filed June 15, 1973, now abandoned.

FIELD OF THE INVENTION

The invention relates to the making of integrated circuits and other micro-miniature electronic components with submicron accuracy.

BACKGROUND OF THE INVENTION

The present invention is an improvement on the electron beam fabrication system and the alignment system therefor described in U.S. Pat. Nos. 3,679,497 and 3,710,101, granted July 25, 1972 and Jan. 9, 1973, respectively, both assigned to the assignee of the present application. In the fabrication system, a planar photocathode source (called an "electromask") produces a patterned beam of electron radiation which is directed onto an electron sensitive layer (called an "electroresist") on a major surface of a substrate spaced from the photocathode to cause a patterned differential in solubility between irradiated and unirradiated areas of the sensitive layer. The pattern in differential solubility is transferred to a pattern in a component layer or body by removing the less soluble portion of the electroresist layer to form a window pattern therein, and subsequently selectively etching or doping the component layer or body through the window pattern developed in the resist layer, or depositing a component layer, such as by evaporation, sputtering, oxidizing or epitaxially growing, through the window pattern in the electroresist layer.

The resolution of the electron image projection system, e.g., less than 0.5 micron, is, however, lost in the juxtaposition of component patterns unless the same resolution can be maintained in the alignment of successive electromasks. Making of an integrated circuit device requires, for example, registration and irradiation of at least 2 to 10 different component patterns in electroresist layers that are subsequently developed and transferred to a component layer by etching, doping or deposition. The electron radiation for each pattern must be aligned with precisely located areas of the major surface each time with a precision of 0.5 micron or less with respect to the first pattern. Otherwise, the precision and economies of the electron image projection system will not be obtained in the finished integrated circuit device.

Apparatus has been developed for precision juxtaposition of multiple component patterns by use of electron beam induced conductivity marks (EBIC). See U.S. Pat. No. 3,710,101, granted Jan. 9, 1973, and U.S. Pat. application Ser. No. 264,699, filed June 20, 1972, both of which are assigned to the same assignee as the present application. At least one and preferably two small spaced apart indexing electron beam pattersn or marks of predetermined cross-sectional shapes are provided on the photocathode source to provide alignment beam portions; and corresponding detector marks of predetermined shape, prefereably the same shape as the corresponding alignment beam portions, are formed in an oxide layer on a substrate and overlaid with a metal layer. At each detector mark, a DC potential is applied across the oxide layer between the metal layer and the substrate. The subsequent current flow between the terminals will vary in correspondence to the portion or area of the detector mark irradiated by the corresponding alignment beam portion. Thus, the alignment beam portion can be precisely aligned with the detector mark by reading the electron induced current corresponding to the area of the detector mark irradiated. The electrical current flow may be processed through an amplifier to actuate a servomechanism to move the photocathode source or the substrate, or to change the magnetic field formed by focusing and deflecting electromagnets surrounding the photocathode source and substrate to align and direct the electron beam pattern, and in turn provide automatic alignment of the alignment beam portion and the detector mark.

One of the difficulties with this alignment system is that it may require the formation of an oxide layer with a well therein of precise depth. In some situations it is inconvenient to maintain an oxide layer on the substrate at certain locations. In other situations, it is difficult, if not impossible to etch the wells in an oxide layer with the precision required. The present invention overcomes these difficulties and provides an alternative method and apparatus for precision alignment of an electron beam with selected areas of a major surface of a substrate.

SUMMARY OF THE INVENTION

A method and apparatus are provided for the alignment of an electron beam with selected areas of a major surface of a substrate with a desired degree of accuracy such as 0.5 micron or less. The invention provides an alternative to previously known methods and apparatus for alignment of an electron beam with a substrate and extends the application of the electron image projection system in the making of precision integrated circuits.

A substrate such as single-crystal silicon is provided with at least one detector mark of predetermined shape adjacent a major surface thereof. Each detector mark is formed by a Schottky barrier contact of the predetermined shape or negative thereof. The predetermined shape of the contacts are preferably all the same and are preferably of a regular geometric shape such as a circle, rectangle or triangle.

An electron beam to be aligned with the substrate is disposed so that at least one alignment portion thereof of predetermined cross-sectional shape irradiates a portion of the major surface in the vicinity of a Schottky barrier detector mark. The electron beam or alignment portions thereof are preferably in substantially the same spatial location as the corresponding detector marks and are made to impinge on and overlap the marks. An electrical signal is produced from each Schottky barrier contact corresponding to the area of the detector mark irradiated by the respective alignment portion of the electron beam. The electron beam is moved relative to the substrate to vary the electrical signal and is subsequently positioned where the electrical signal indicates alignment of each alignment beam portion with a corresponding detector mark.

The Schottky barrier detector marks of predetermined shape can be made in any suitable way. For example, the Schottky barrier contact for the mark may be formed by providing generally widely spaced apart oxide layers on the major surface of the substrate, cutting, e.g., by etching or ion milling, through the oxide layers to expose portions of the major surface and form windows corresponding in shape to the desired Schottky barrier detector marks, and applying a metal layer over each oxide layer and the exposed portions of the major surface to form a Schottky barrier contact with the substrate at each exposed portion of the major surface in the predetermined shape of the desired detector. Alternatively, the Schottky barrier detector marks may be formed by applying metal layers to the major surface of the substrate to form spaced away Schottky barrier contacts with the substrate and thereafter forming in the metal layers wells of planar shape corresponding to the predetermined shape of the Schottky barrier detector marks. In another alternative, the Schottky barrier contacts for the marks may be formed by applying spaced apart metal layers to the major surface of the substrate to form Schottky barrier contacts with the surface, applying an oxide layer over ech metal layer to mask the metal layer against electron induced conductivity and then cutting, e.g., by etching or ion milling, through each oxide layer to expose portions of each metal layer of planar shape corresponding to the predetermined shape of the desired Schottky barrier detector mark. Where the substrate is not capable of forming a Schottky barrier with a metal layer, preferably a semiconductor layer is epitaxially grown on the major surface of the substrate and the Schottky barrier detector marks formed in one of the above-stated ways with the epitaxial layer. In these embodiments, it is not even necessary that the substrate be conductive because the semiconductor layer may act as the collector for the electron induced conductivity.

In still other alternatives, the detector marks are provided by Schottky barrier contacts which sense an absence of electron induced conductivity. For example, the Schottky barrier contacts providing the detector marks may be formed by applying spaced away metal layers to the major surface of the substrate to form Schottky barriers with the substrate, and thereafter cutting through the metal layers to expose portions of the major surface and form windows corresponding in shape to the desired detector makrs. Alternatively, the Schottky barrier contacts for the detector marks may be formed by applying spaced apart metal layers to the major surface of the substrate to form Schottky barriers with the substrate, and thereafter cutting, e.g., by etching or ion milling, in each metal layer the negative of the planar shape corresponding to the predetermined shape of the desired detector mark to form a mesa in each metal layer of the planar shape corresponding to the desired detector mark.

Irrespective of the embodiment, the present invention is particularly useful in production of a very accurate component pattern or patterns in an electroresist layer or series of electroresist layers on the major surface of a substrate, for example, in the making of an integrated circuit. Typically, the alignment is accomplished to selectively irradiate the electroresist layers with a patterned beam of electrons generated by a photocathode source.

In aligning the photocathode source with precisely located areas of the major surface of the substrate in an electron image projection system, preferably two widely spaced Schottky barrier contacts of predetermined shapes are positioned preferably opposite each other along the periphery on the major surface of the substrate, and corresponding alignment beam portions of predetermined cross-sectional shapes are provided as part of the patterned electron beam generated by the photocathode source. The electrical signal generated by impingement of the alignment beam portion on the Schottky barrier contact corresponds to the area of irradiation of a corresponding detector mark with corresponding alignment beam portion. The patterned electron beam is then moved relative to the substrate, either manually or automatically, until the electrical signal indicates optimum alignment of the aligning beams and detector marks provided by the Schottky barrier contacts.

The alignment beam portions and the detector marks may be of any suitable relative size within practical limits provided the shapes of both are predetermined. Preferably, however, each alignment beam portion is of the same cross-sectional shape as the predetermined shape of the corresponding detector mark so that alignment can be determined simply by reading a maximum or a minimum in the electrical signal. Otherwise, electrical processing of the electrical signals are needed, while the alignment beam portions are oscillated over the corresponding detector marks, to determine optimum alignment of the alignment beam portions with the corresponding detector marks.

Preferably, the alignment is done automatically by an electrical means which moves the patterned beam of electrons relative to the substrate responsive to the electrical signals from the Schottky barrier detector marks. The electrical means preferably includes for this purpose a modulation means for oscillating the movement of each alignment beam portion over a corresponding detector mark; phase detection means, preferably synchronized with the modulation means, for detecting along orthogonal axis the error from alignment of the alignment beam portion and the mark and outputting an electrical signal corresponding thereto; and actuating means for changing the electrical input to electromagnetic means directing the patterned electron beam from the photocathode source onto the major surface or the substrate responsive to the electrical signal from the phase detector means. Preferably the electrical means also inclues termination means for terminating the oscillation by the modulation means and the electrical signal by the actuating means at optimum alignment of the alignment beam portions and the Schottky barrier detector marks.

Other details, objects and advantages of the invention will become apparent as the following description of the presently preferred embodiments and presently preferred methods of practicing the same proceeds.

BRIEF DESCRIPTION OF THE DRAWINGS

In the accompanying drawings, the present preferred embodiments of the invention and the present preferred methods of practicing the invention are illustrated in which.

DESCRIPTION OF THE PREFERRED EMBODIMENTS

An electron image projection device suitable to practice the present invention is described in above-referred U.S. Pat. Nos. 3,679,497 and 3,710,101 except for the alignment technique and apparatus therefor. For convenience and clarity of description the device is redescribed in part here.

Figure 1:
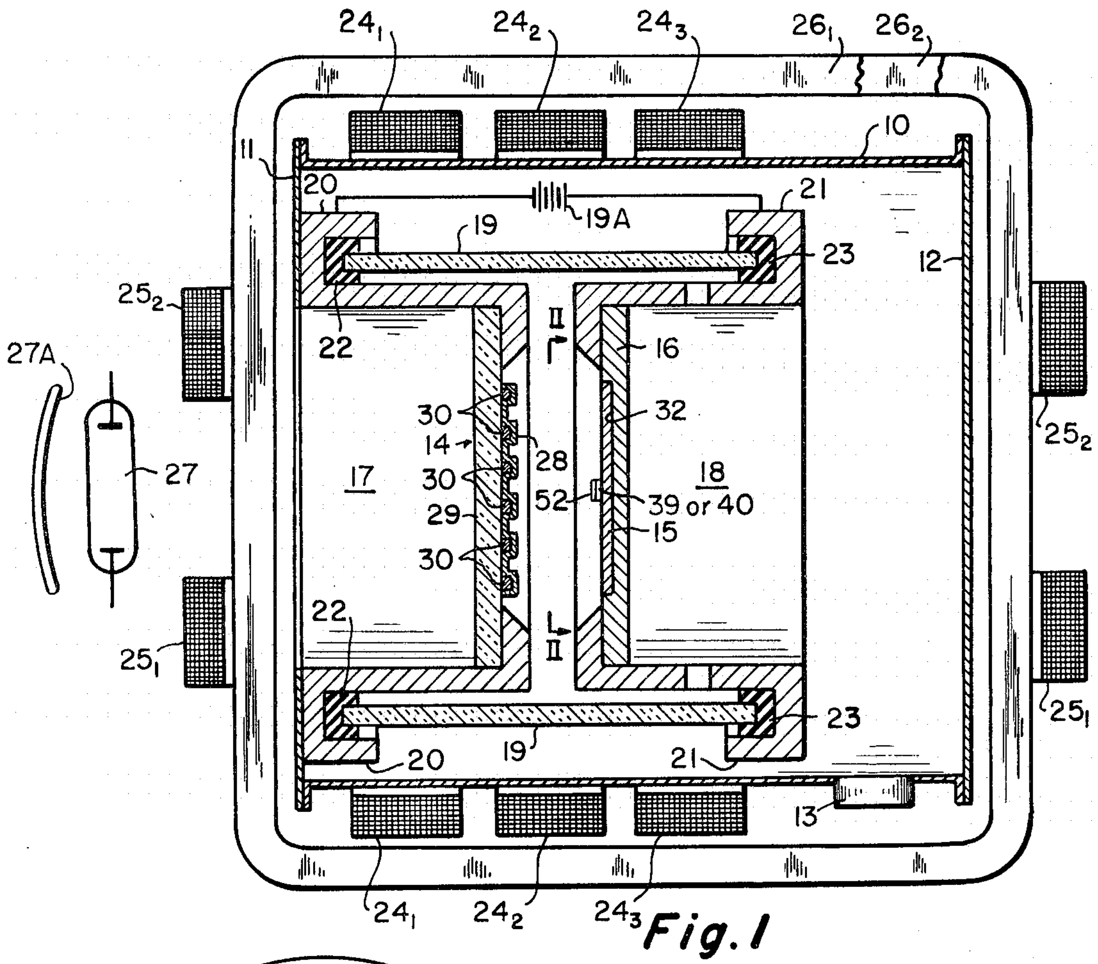
FIG. 1 is a cross-sectional view in elevation of an electron image projection device employing the present invention.

Referring to FIG. 1, an electron image projection device is shown. A hermetically sealed chamber 10 of nonmagnetic material has removable end caps 11 and 12 to allow for disposition of apparatus into and removal of apparatus from the chamber. A vacuum port 13 is also provided in the sidewall of chamber 10 to enable a partial vacuum to be established in the chamber after it is hermetically sealed.

Disposed within chamber 10 is cylindrical photocathode source or electromask 14 and alignable substrate 15 (e.g., a semiconductor wafer) in parallel, spaced relation. Substrate 15 is supported in specimen holder 16 as more fully described later. Photocathode 14 and holder 16 are in turn positioned in parallel array by annular disk-shaped supports 17 and 18, respectively. Photocathode 14 and holder 16 are spaced apart with precision by tubular spacer 19 which engages grooved flanges 20 and 21 via gaskets 22 and 23 around the periphery of supports 17 and 18. The entire assembly is supported from end cap 11 of chamber 10 at support 17 to allow for ease of disposition of the photocathode source and the substrate within the chamber.

Photocathode source 14 is made cathodic and substrate 15 is made anodic to direct and accelerate electrons emitted from the electromask to the substrate 15. To accomplish this, holder 16 and supports 17 and 18 are of highly conductive material and spacer 19 is of highly insulating material. A potential 19A of, for example, −10Kv, is applied between supports 17 and 18. The difference in potential is conducted to and impressed on photocathode source 14 and substrate 15 via supports 17 and 18 and holder 16.

Surrounding chamber 10 are three series of electromagnetic coils, positioned perpendicular to each other, to control the impingement of the electron beam on member 15. Cylindrical electromagnetic coils $24_1$, $24_2$ and $24_3$ are positioned axially along the path of the electron beam from photocathode 14 to substrate 15 to cause electrons to spiral and move radially as they travel the distance from the photocathode source to the substrate and in turn focus the electron beam pattern. These electromagnetic coils also permit control of the rotation ($\theta$) and the magnification (M) of a patterned electron beam emitted from the photocathode source. Rectangular electromagnetic coils $25_1$ and $25_2$, and $26_1$ and $26_2$ are symmetrically positioned in Helmholtz pairs perpendicular to each other and to electromagnetic coils $24_1$–$24_3$ to cause electrons to transversely deflect as they travel the distance from the photocathode to the substrate. These electromagnetic coils permit control of the direction (in X and Y coordinates) of a patterned electron beam emitted from the photocathode source.

In operation, light source 27 such as a mercury vapor lamp backed by reflector 27A irradiates a photocathode layer 28 (e.g., gold or palladium) in the photocathode source 14. The photocathode layer is irradiated through a substantially transparent substrate 29 such as quartz overlaid with a layer 30 containing the negative of a desired component pattern. The layer 30 is of material (e.g., titanium dioxide) which is opaque to the light radiation. The photocathode material is thus made electron emissive in a patterned electron beam corresponding to the desired component pattern. A part of the patterned electron beam emitted from the photocathode source 14 is at least one and preferably two alignment beam portions 43 and 44 of predetermined cross-sectional shape (e.g., squares of 300 × 300 microns) which are widely separated and preferably positioned opposite each other along the periphery of the patterned beam.

Figures 2, 3:
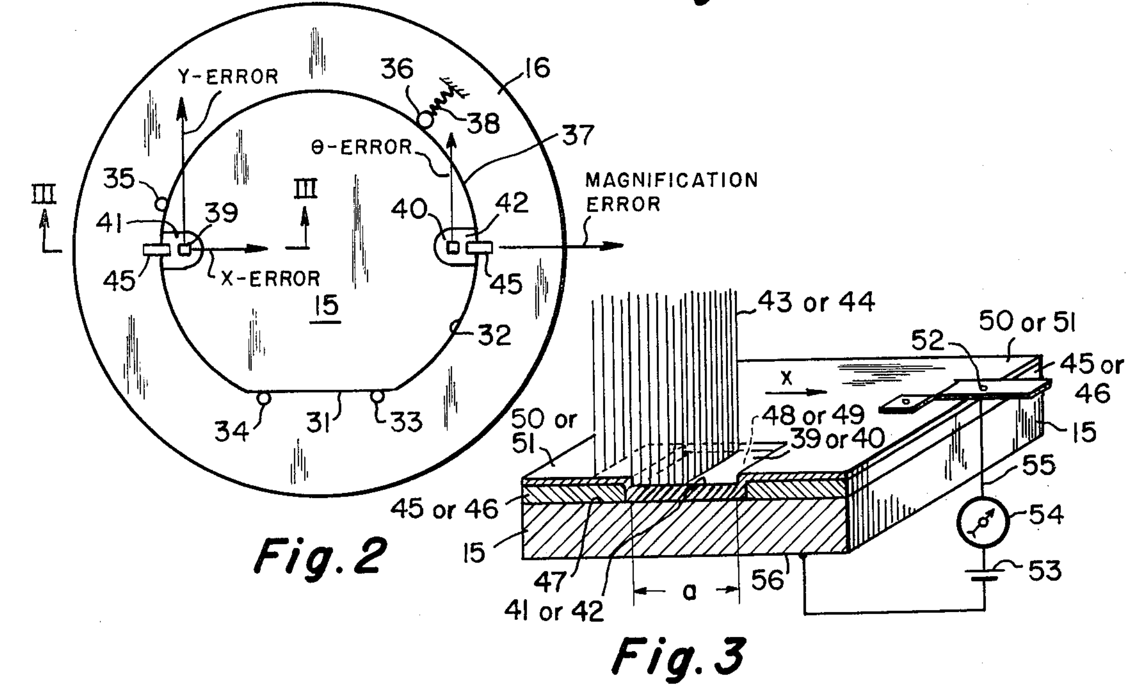
FIG. 2 is a fragmentary cross-sectional view in elevation taken along line II—II of FIG. 1.
FIG. 3 is a fragmentary cross-sectional view in perspective taken along line III—III of FIG. 2.

Referring to FIG. 2, substrate 15 is precision mounted within physically permissible limits in holder 16 and in turn with respect to photocathode source 14. Substrate 15 has a flat peripheral portion 31; and holder 16 has depression 32 into which substrate 15 fits. Holder 16 has pins 33, 34, 35 and 36 positioned in respective quadrants around the periphery of depression 32. Substrate 15 is positioned by resting flat peripheral portion 31 of substrate 15 against pins 33 and 34 and curvilinear peripheral portion 37 of substrate 15 against pin 35. The substrate is thereby located with an accuracy of about 25 microns or less. Movable pin 36, which is fitted with a compression spring 38, is positioned and pushed against the curvilinear portion of substrate 15 to firmly retain substrate 15 and in turn, maintain substrate 15 precisely located.

Referring particularly to FIG. 3, the details are shown of a preferred embodiment of detector marks 39 and 40 formed by Schottky barrier contacts. Each detector mark has major surface 41 or 42 having well 48 or 49, respectively, corresponding in a predetermined shape, preferably the same as the cross-sectional shape of the corresponding alignment beam portion 43 or 44. As shown in FIG. 3, the Schottky barrier detector marks are formed by first forming spaced apart oxide layers 45 and 46 of substantial thickness (i.e., greater than 1 micron for a 10 Kv electron beam) on major surface 47 of substrate 15. For convenience, layers 45 and 46 can be formed by sputter depositing silicon dioxide over the entire surface 47, or simply heating substrate 15 where it is of an appropriate composition (e.g., silicon), and thereafter etching or ion milling the major portion of the oxide layer away simultaneously with the formation of wells 48 and 49 as described. Oxide layers 45 and 46 are etched or ion milled through to expose surface portions of major surface 47 and form wells 48 and 49 by known masking and cutting techniques. The wells 48 and 49 are each of the same predetermined shape corresponding to the desired shape for the Schottky barrier detector marks 39 and 40. Over oxide layers 45 and 46 and the exposed surface portions of surface 47 is then deposited metal layers 50 and 51 to form Schottky barrier contacts with substrate 15 at the exposed surface portions at wells 48 and 49 in the predetermined shape of the desired detector marks. The metal suitable for layer 50 will, of course, vary with the composition of substrate 15 because the metal selected must have a thermionic work function greater than the work function of substrate 15 where the substrate is an N-doped semiconductor material, and alternatively, must have a thermionic work function less than the work function of the substrate where the substrate is a P-doped semiconductor material. Some metals suitable for formation of Schottky barrier contacts with silicon are platinum silicide, chromium-gold alloy, chromium silicide, molybdenum-gold alloy and titanium silicide. In any event, layers 50 and 51 must be sufficiently thin to allow the electron beam to penetrate it without substantial scattering and yet sufficiently thick to eliminate electron charge build-up in the oxide layers and substrate, e.g., about 200 A for a 10 Kv electron beam.

An electrical contact 52 is attached at each metal layer 50 and 51 to make ohmic contact therewith. Preferably DC power source 53, e.g., a battery, and current flow indicator 54, e.g., ammeter or cathode ray tube, are attached in series in a circuit 55 which ohmically connects between contact 52 and the opposed major surface 56 of substrate 15 opposite the metal layers 50 and 51.

In operation, the alignment beam portions 43 and 44 of predetermined cross-sectional shape impinge on and overlap the Schottky barrier detector marks 39 and 40 of predetermined shapes, respectively. The electron beam induced current produced corresponds to the area of overlap between the electron beams 43 and 44 and the detctor marks 39 and 40. Where the alignment beam portions and the corresponding detector marks are of the same predetermined shapes, alignment can be accurately made simply by observing the maximum current reading from indicator 54 as the electron beam from photocathode source 14 is moved relative to substrate 15. This may be done without applying a potential as provided by power source 53; however, an applied potential provides for more accurate and more responsive readings at indicator 54.

Figure 4:
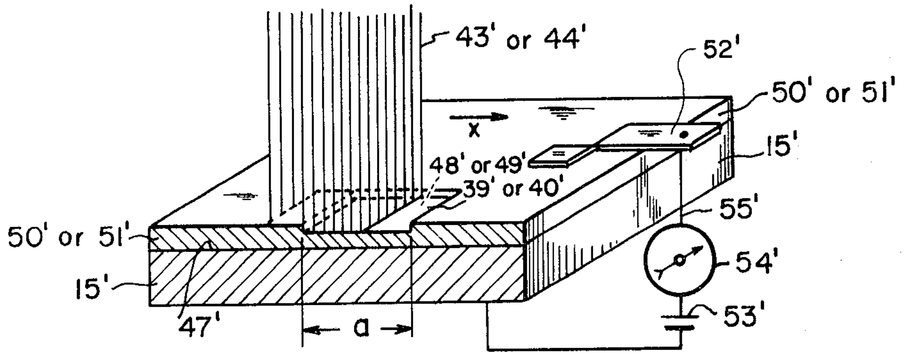
FIG. 4 is an alternative fragmentary cross-sectional view in perspective taken along line III—III of FIG. 2.

Referring to FIGS. 4, 5, 6, 7, 8 and 9, alternatives are shown for the Schottky barrier detector marks 39 and 40. Specifically, as shown in FIG. 4, spaced apart detector marks 39' and 40' of predetermined shapes are formed by first applying spaced apart metal layers 50' and 51' to major surface 47' of substrate 15' by standard sputtering or vapor depositing techniques to form Schottky barrier contacts with substrate 15'. The detector marks 39' and 40' of predetermined shape are thereafter provided by forming wells 48' and 49' in layers 50' and 51', respectively, by known masking and cutting techniques. With the circuit 55' provided as above described in reference to FIG. 3, electron induced conductivity is produced which corresponds to the thickness of layers 50' and 51' irradiated and in turn to the areas of wells 48' and 49' irradiated. To provide a significant difference in conductivity between the wells and the surrounding layers, layers 50' and 51' should be of substantial density and thickness corresponding to the electron beam energy, e.g., 0.2 milligrams/cm² for a 10 kilovolt beam, and should be reduced substantially in thickness at the wells 48' and 49', preferably to 10 to 50 percent of thickness of layers 50' and 51'. It should be noted that alternatively the same detector marks 39' and 40' may be formed by first forming metal layers over major surface 47' corresponding in thickness to layers 50' and 51' at wells 48' and 49', selectively masking the layers where the marks 39 and 40 are desired, and then selectively applying a second metal layer to the thickness of layers 50' and 51'.

Figure 5:
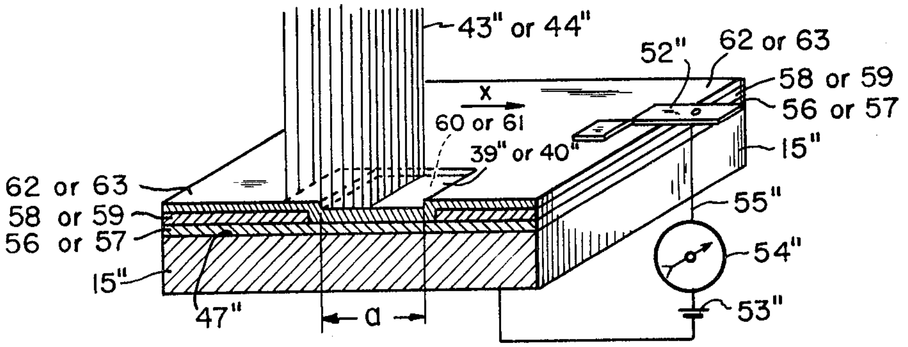
FIG. 5 is a second alternative fragmentary cross-sectional view in perspective taken along line III—III of FIG. 2.

Referring to FIG. 5, alternative Schottky barrier detector marks 39'' and 40'' of predetermined shapes are provided wherein the substrate 15'' is not capable of forming a Schottky barrier with a metal layer. Detector marks 39'' and 40'' are formed by first epitaxially growing semiconductor layers 56 and 57 on major surface 47'' of substrate 15''. This epitaxial growth can be done by either known selective epitaxial techniques or indiscriminate epitaxial growth plus selective etching or ion milling. Oxide layers 58 and 59 can then be formed in layers 56 and 57, respectively, by standard sputtering or heating techniques. The oxide layers are then cut through by standard masking and etching or ion milling techniques to expose surface portions of semiconductor layers 56 and 57 and form wells 60 and 61 in layers 58 and 59, respectively, corresponding to the predetermined shapes of detector marks 39'' and 40''. Metal layers 62 and 63 are then formed over oxide layers 58 and 59 and the exposed surface portions of semiconductor layers 56 and 57 at wells 60 and 61, respectively, to form Schottky barrier contacts with semiconductor layers 56 and 57. The metal used to form metal layers 58 and 59 will, of course, vary with the composition of semiconductor layers 56 and 57 and their doping. Preferably, the metal is as heretofore described with reference to metal layers 50 and 51 and has thickness as described with respect to Schottky barrier detector marks 39 and 40. Again DC power sources 53'', and current flow indicator 54'' are attached in series in circuits 55'' with electrical contact 52'' making ohmic contact to each metal layer 58 or 59. As shown, the substrate 15'' has conductive properties so that it provides for carrier collection in operation. Alternatively, where substrate 15'' is of sapphire or the like, which is not electrically conductive, circuits 55'' are in series between the metal and semiconductor layers.

Figure 6:
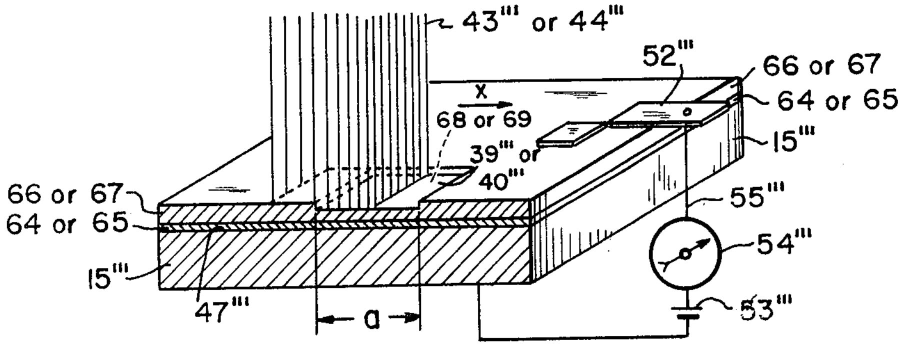
FIG. 6 is a third alternative fragmentary cross-sectional view in perspective taken along line III—III of FIG. 2.

Referring to FIG. 6, an alternative is shown for Schottky barrier detector marks 39 and 40 of predetermined shapes where the substrate is not capable of forming Schottky barrier contacts with a metal layer. Specifically, detector marks 39'' and 40'' of predetermined shapes are provided by Schottky barrier contacts by first epitaxially growing semiconductor layers 64 and 65, as above described with reference to layers 56 and 57, on major surface 47''' of substrate 15'''. Metal layers 66 and 67 are then applied over semiconductor layers 64 and 65, respectively, to form Schottky barrier contacts therewith. The detector marks 39''' and 40''' of predetermined shapes are then provided by forming wells 68 and 69 in layers 64 and 65, respectively, by known masking and cutting techniques. With this arrangement, electron induced conductivity is produced which corresponds to the thickness of layers 64 and 65 that are irradiated and in turn to the areas of wells 68 and 69 which are irradiated as above described with reference to FIG. 5. However, the substrate 15''' need not be capable of providing a Schottky barrier contact or even be conductive where circuits 55''' are in series between metal layers 66 and 67 and semiconductor layers 64 and 65, respectively.

Figure 7:
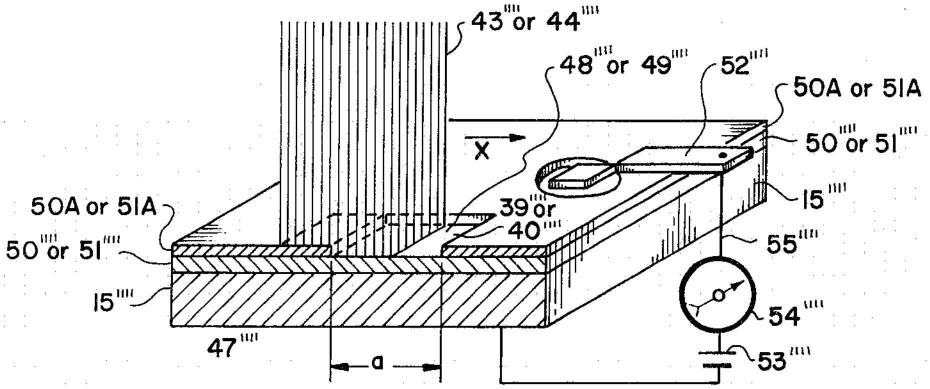
FIG. 7 is a fourth alternative fragmentary cross-sectional view in perspective taken along line III—III of FIG. 2.

Referring to FIG. 7, still another alternative is shown for detector marks 39 and 40 of predetermined shapes formed by Schottky barrier contacts similar to that shown in FIG. 4. Specifically spaced apart detector marks 39'''' and 40'''' of predetermined shapes are formed by first applying spaced apart metal layers 50'''' and 51'''' to major surface 47'''' of substrate 15'''' by standard sputtering and vapor depositing techniques to form Schottky barrier contacts with substrate 15''''. Oxide layers 50A or 51A are then formed over metal layers 50'''' and 51'''', respectively, by standard sputtering and vapor deposition techniques. The thickness of the oxide layers is sufficient to block significant penetration of the corresponding alignment portions 43'''' and 44'''' through the oxide layers. Wells 48'''' and 49'''' are then formed by masking and cutting through oxide layers 50A and 51A in the predetermined shape of the detector marks 39'''' and 40''''. Simultaneously wells 52A are cut through oxide layers 50A and 51A to expose surface portions of layers 50'''' and 51'''' so that ohmic connections between metal layers 50'''' and 51'''' and electrical contacts 52'''' are made. By the circuit 55'''' provided as above described in reference to FIG. 3, the electron beam induced current produced corresponds to the area of overlap between alignment beam portions 43'''' and 44'''' and corresponding detector marks 39'''' and 40'''', respectively. Again, where the alignment beam portions and corresponding detector marks are of the same predetermined shape, alignment can be accurately made simply by observing the maximum current reading from indicator 54''''.

Figure 8:
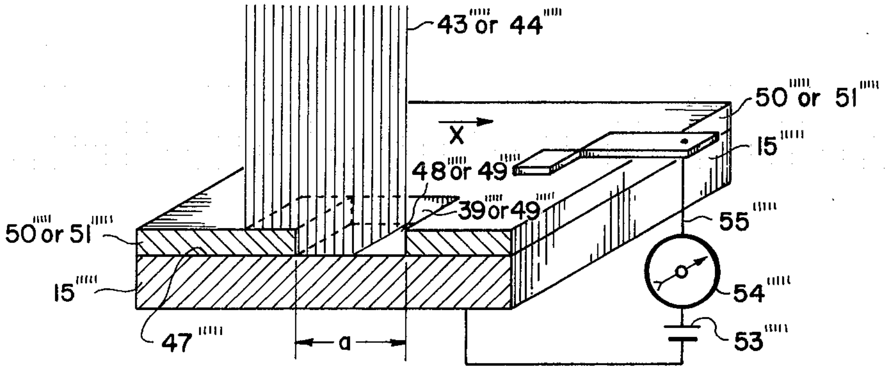
FIG. 8 is a fifth alternative fragmentary cross-sectional view in perspective taken along line III—III of FIG. 2.

Referring to FIG. 8, a further alternative embodiment is shown for detector marks 39 and 40 where what is sensed is the absences of electron induced conductivity. The construction is similar to FIG. 4. Specifically, detector marks 39''''' and 40''''' of predetermined shapes are formed by first applying apart metal layers 50'''' and 51'''' to major surface 47''''' of substrate 15''''' by standard sputtering and vapor deposition techniques to form Schottky barrier contacts with substrate 15'''''. The detector marks 39''''' and 40''''' of predetermined shapes are therefore provided by cutting through layers 50''''' and 51''''' to expose portions of major surface 47''''' and form wells 48''''' and 49'''''. With the circuit 55''''' as otherwise described with reference to FIG. 3, alignment can be accurately made by observing the minimum current reading from indicator 54''''' where the alignment beam portions and corresponding detector marks are of the same predetermined shape. Again, the electron beam induced current produced corresponds to the area of overlap between the alignment beam portions 43''''' and 44''''' and the detector marks 30''''' and 40''''', respectively, bt the Schottky barrier contact is reading an absence of overlap rather than a presence of overlap.

Figure 9:
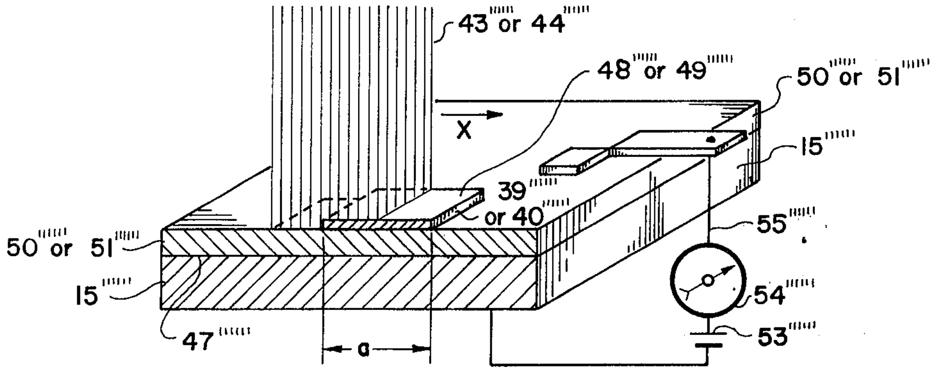
FIG. 9 is a sixth alternative fragmentary cross-sectional view in perspective taken along line III—III of FIG. 2.

Referring to FIG. 9, another alternative embodiment is shown for detector marks 39 and 40 where what is sensed is the absence of electron induced conductivity. Again the construction is similar to FIG. 4. Again detector marks 49'''''' and 40'''''' of predetermined shapes are formed by first applying spaced apart metal layers 50'''''' and 51'''''' to major surface 47'''''' of substrate 15'''''' by standard sputtering and vapor deposition techniques to form Schottky barrier contacts with substrate 15''''''. The detector marks 39'''''' and 40'''''' of predetermined shape are therefore provided by forming means 48'''''' and 49'''''' on layers 50'''''' and 51'''''', respectively, masking at the mesa areas and cutting the negative thereof into the metal layers. By this arrangement, with circuit 55'''''' as above described, electron induced conductivity is produced which corresponds to the thickness of layers 50'''''' and 51'''''' irradiated and in turn to the areas of mesa 48'''''' and 49'''''' irradiated, whereby where the alignment beam portions and corresponding detector marks are of the same predetermined shape, alignment is obtained by observing the minimum current reading similar to the embodiment of FIG. 8.

Where the predetermined cross-sectional shape of the alignment beam portions are different from the predetermined shape of the corresponding detector marks, the reading of indicators 54 to determine optimum alignment is somewhat different than above described. Optimum alignment is no longer indicated by the maximum or minimum in the signal readings from the indicators. Rather, a plateau is reached in each signal reading, and optimum alignment is achieved by either selecting the mean point on each plateau taking into consideration any difference in the geometric shapes between the alignment beam portions and coresponding detector marks, or selecting the mean point on the signal rise from a corresponding detector means as the alignment beam portions move into or out of the areas of the detector marks. The latter alignment sequence permits alignment with the edge of the detector mark. Any of these embodiments may be readily used in either a manual or automatic alignment system with electrical signal processing apparatus such as that hereinafter described.

Further, manual aligning of the electron beam pattern with selected areas of the major surface of the substrate may be employed irrespective of the embodiment of the Schottky barrier detector marks utilized. Manual operation is, however, not preferred in commercial applications because it is time consuming and subject to human errors in observing the current reading at the indicator 54. For these reasons, it is preferred that the electrical signals from the Schottky barrier detector marks be electronically processed to control and operate alignment means such as the electromagnetic coils $24_1$, $24_2$, $24_3$, $25_1$, $25_2$, $26_1$ and $26_2$ and automatically position the alignment beam portions where the electrical signals indicate optimum alignment of the alignment beam portions and the Schottky barrier detector marks. Not only can the optimum response position be obtained more rapidly, but the human error is eliminated with the same response point indicated each time alignment is performed.

Figure 10:
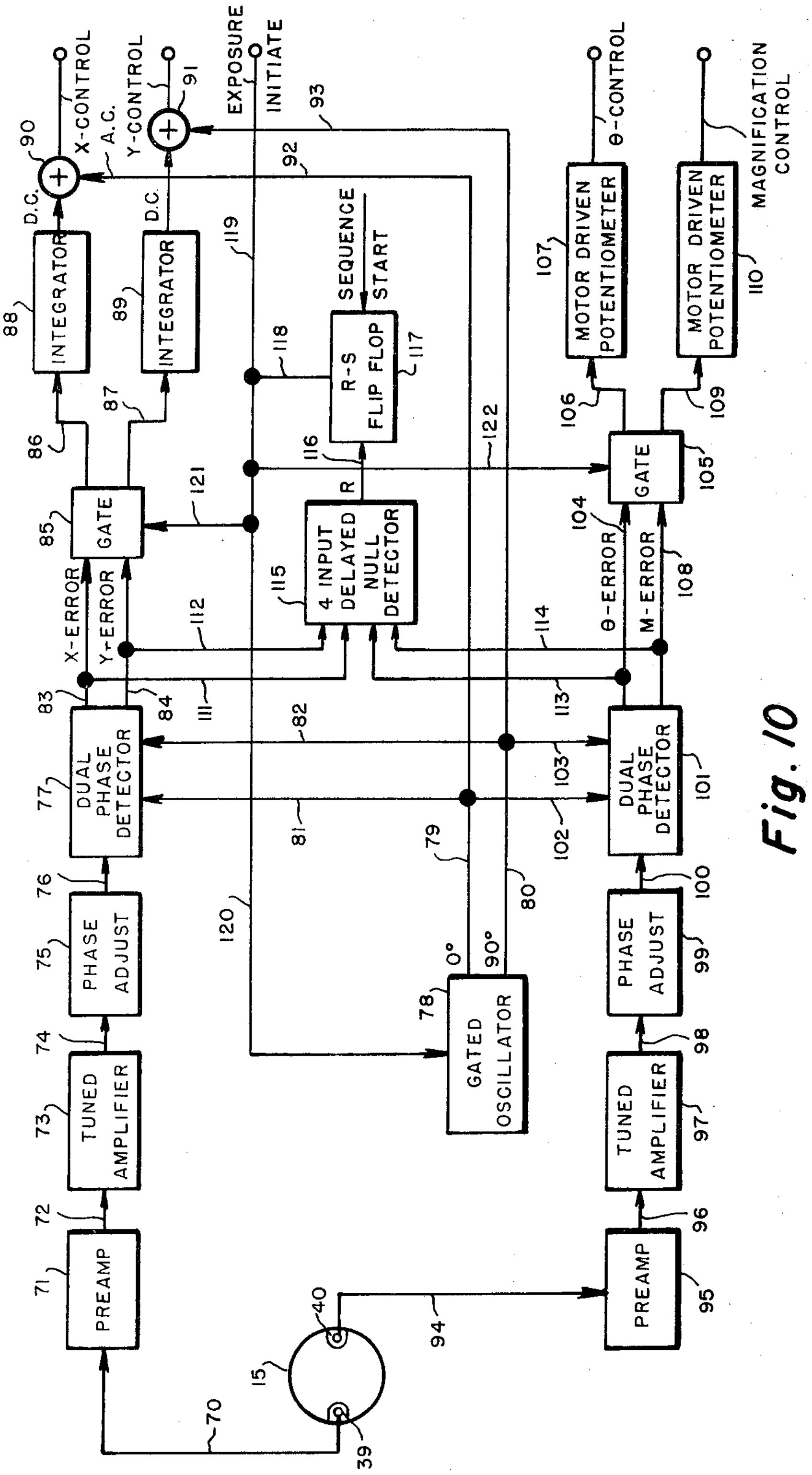
FIG. 10 is a block diagram of an electrical circuit for the electron image projection device shown in FIG. 1 to automatically align the electron beam pattern in accordance with the present invention.

Referring to FIG. 10, a block diagram of electrical means is shown to automatically align alignment beam portions 43 and 44 with Schottky barrier detector marks 39 and 40 of the same predetermined shapes, and in turn precision align the patterned electron beam from photocathode source 14 with selected areas of the major surface of the substrate 15. The modulated electrical signal from Schottky barrier detector mark 39 is conveyed via lead 70 to a preamplifier 71, which amplified signal is then conveyed via lead 72 to a tuned amplifier 73. The output of amplifier 73 passes through lead 74 to a phase adjustor 75 and then through lead 76 to a dual phase detector 77. A gated oscillator 78 impresses reference signals, which are 90° out-of-phase, through conductors 79 and 80 and conductors 81 and 82, respectively, on the dual phase detector 77. The outputs of phase detector 77 thus comprise X-error signals via lead 83 and Y-error signals via lead 84, which pass through gate 85 via leads 86 and 87 to integrators 88 and 89, respectively. The integrators 88 and 89 have direct-current outpus to adders 90 and 91, respectively, where the outputs are modulated with alternating current from the oscillator 78 via leads 92 and 93, respectively. The added modulated signals are then passed to and adjacent the controls in power units (not shown) of the type customarily used to control the electromagnetic coils $25_1$, $25_2$, $26_1$ and $26_2$.

Similarly, the modulated signal from the Schottky barrier detector mark 40 is conducted via lead 94 to preamplifier 95, and passed thereafter via lead 96 to the tuned amplifier 97 and then via lead 98 through phase adjustor 99 and lead 100 to dual phase detector 101. Oscillator 78 also impresses the two 90° out-of-phase reference signals, above referred to, through leads 102 and 103 on dual phase detector 101. Two outputs from dual phase detector 101 are thus produced. The one output signal via conductor 104, which corresponds to a $\theta$ error signal, passes through gate 105 and lead 106 to control a motor-driven precision potentiometer 107 to effect the rotational control of the electron beam pattern by increasing or decreasing the current to the electromagnetic coils $24_1$, $24_2$ and $24_3$. The other output signal through lead 108, gate 105 and lead 109 to control the size of the patterned electron beam through a motor driven gang potentiometer 110 which adjusts the main focus field.

The error signals in conductors 83, 84, 104 and 108 are cross-fed electronically via leads 111, 112, 113 and 114, respectively, into a four input delayed null detector 115 whose output is conveyed by lead 116 to a set-reset flip-flop 117. The operation of the flip-flop is initiated by actuation of a start sequence switch, whereupon current begins to flow via leads 118 and 119 to energize the ultraviolet source 28 to cause electron beams to be emitted from photocathode source 14, including the two alignment beam portions 43 and 44. Likewise, current from 118 passes through lead 120 to the gated oscillator 78, which in turn feeds sinusoidal signals in quadrature through lines 79–92 and 80–83 to the X and Y controls 90 and 91, respectively. The entire electron beam pattern, including the alignment beam portions 43 and 44, are thus caused to oscillate typically in a circle of, for example, 6 microns diameter at a frequency of 45 Hertz.

Once the aligning electron beams 43 and 44 are centered on Schottky barrier detector marks 39 and 40, respectively, by operation of integrators 88 and 89, and potentiometers 107 and 110, the error signals passing through leads 111, 112, 113 and 114 reach a zero value which is detected by the null detector 115. The null detector thereupon produces an electrical signal which passes through lead 116 to the flip-flop 117, which terminates the operation of the gated oscillator 78 and closes gates 85 and 105 by signals through leads 121 and 122, respectively. The time sequence of the selective electron beam exposure of an electroresist layer on the major surface 47 of substrate 15 is then begun and continued until the resist is fully exposed. A period of from 3 to 10 seconds is usually adequate to produce a sufficient electron beam treatment of the electron resist to cause it to be properly differentially soluble in selected solvents. The photocathode source 14 has been generating a patterned electron beam from all the emissive areas during the alignment period; however, the alignment period is so brief that the electroresist on all the areas of the substrate 15 has not been significantly exposed.

While the present invention is particularly suited and has been specifically described to align an electron image projection system, it is distinctly understood that the invention may be otherwise variously embodied and used. For example, the invention may be used in the procedure for precision etching of selected areas of metal sheets to obtain desired shapes and patterns for various scientific and industrial applications.

What is claimed is:

1. A method of aligning a patterned electron beam generated by a photocathode source with selected areas of a major surface of a substrate with a high degree of precision comprising the steps of:

A. forming adjacent a major surface of a substrate at least two spaced apart detector marks of predetermined shapes of Schottky barrier contacts;

B. causing a patterned electron beam having alignment beam portions corresponding to the detector marks of Schottky barrier contacts to be projected by a photocathode source onto the major surface, each said alignment beam portion having a predetermined cross-sectional shape;

C. causing an electrical signal to be developed at each said detector mark corresponding to the area of the contact irradiated by a corresponding alignment beam portion;

D. moving the electron beam pattern relative to the substrate while continuing step C so that the electrical signal varies; and E. positioning the electron beam relative to the substrate where the electrical signal indicates optimum alignment of the alignment beam portions with corresponding detector marks of the Schottky barrier contacts.

2. A method of aligning a patterned electron beam generated by a photocathode source with selected areas of a major surface of a substrate with a high degree of precision as set forth in claim 1 wherein:

the detector marks are formed by providing spaced apart oxide layers on the major surface, cutting through the oxide layers to expose portions of the major surface and form windows corresponding in shapes to the predetermined shapes of the detector marks, and applying metal layers over the oxide layers and the exposed portions of the major surface to form Schottky barrier contacts with the substrate at the exposed portions of the major surface.

3. A method of aligning a patterned electron beam generated by a photocathode source with selected areas of a major surface of a substrate with a high degree of precision as set forth in claim 1 wherein:

the detector marks are formed by applying spaced apart metal layers to the major surface of the substrate to form Schottky barrier contacts with the substrate and thereafter cutting in the metal layers wells corresponding in shapes to the predetermined shapes of the detector marks.

4. A method of aligning a patterned electron beam generated by a photocathode source with selected areas of a major surface of a substrate with a high degree of precision as set forth in claim 1 wherein:

the detector marks are formed by appling spaced apart metal layers to the major surface of the substrate to form Schottky barrier contacts with the substrate, and thereafter cutting the metal layers to expose portions of the major surface corresponding to the predetermined shapes of the detector marks.

5. A method of aligning a patterned electron beam generated by a photocathode source with selected areas of a major surface of a substrate with a high degree of precision as set forth in claim 1 wherein:

the detector marks are formed by appling spaced apart metal layers to the major surface of the substrate to form Schottky barrier contacts with the substrate, applying an oxide layer over each metal layer to mask the metal layer against electron induced conductivity, and then cutting through each oxide layer to expose portions of each metal layer of shape corresponding to the predetermined shape of the detector mark.

6. A method of aligning a patterned electron beam generated by a photocathode source with selected areas of a major surface of a substrate with a high degree of precision as set forth in claim 1 wherein:

the detector marks are formed by applying spaced apart metal layers to the major surface of the substrate to form Schottky barriers with the substrate, and thereafter cutting in the metal layers and the negative of the shapes corresponding to the predetermined shapes of the detector marks to form mesas in the respective metal layer of shapes corresponding to the desired detector marks.

7. A method of aligning a patterned electron beam generated by a photocathode source with selected areas of a major surface of a substrate with a high degree of precision as set forth in claim 1 wherein:

the detector marks are formed by epitaxially growing semiconductor layers on the substrate and thereafter applying metal layers to the semiconductor layers to form the Schottky barrier contacts therewith.

8. A method of aligning a patterned electron beam generated by a photocathode source with selected areas of a major surface of a substrate with a high degree of precision as set forth in claim 1 wherein:

steps D and E are automatically performed by electrically processing said electrical signal on modulation of the movement of the alignment beam portions over the contacts, and steps D and E automatically are terminated at optimum alignment of the alignment beam portions and the contacts.

9. A method of aligning a patterned electron beam generated by a photocathode source with selected areas of a major surface of a substrate with a high degree of precision as set forth in claim 1 wherein:

each detector mark is of substantially the same predetermined shape as the predetermined cross-sectional shape of a corresponding alignment beam portion.

10. A method of precisely aligning an electron beam with selected areas of a major surface of a substrate comprising the steps of:

A. forming adjacent a major surface of a substrate at least one detector mark of predetermined shape of a Schottky barrier contact;

B. causing at least one electron beam to be aligned to be projected onto the major surface, said electron beam having at least one alignment beam portion corresponding to at least one said detector mark and of a predetermined cross-sectional shape;

C. causing an electrical signal to be developed at said detector mark corresponding to the area of the detector mark irradiated by a corresponding alignment beam portion;

D. moving the electron beam relative to the substrate while continuing step C so that the electrical signal varies; and E. positioning the electron beam relative to the detector mark where the electrical signal indicates optimum alignment of the alignment beam portions with the corresponding detector marks.

11. A method of precisely aligning an electron beam with selected areas of a major surface of a substrate as set forth in claim 10 wherein:

the detector mark is formed by forming an oxide layer on the major surface, cutting through the oxide layer to expose portions of the major surface and form a window corresponding in shape to the predetermined shape of the detector mark, and applying a metal layer over the oxide layer and the exposed portion of the major surface to form a Schottky barrier contact with the substrate at the exposed portion of the major surface.

12. A method of precisely aligning an electron beam with selected areas of a major surface of a substrate as set forth in claim 10 wherein:

the detector mark is formed by applying a metal layer to the major surface of the substrate to form a Schottky barrier contact with the substrate and, thereafter cutting in the metal layer a well of shape corresponding to the predetermined shape of the detector mark.

13. A method of precisely aligning an electron beam with selected areas of a major surface of a substrate as set forth in claim 10 wherein:

the detector marks are formed by applying spaced apart metal layers to the major surface of the substrate to form Schottky barrier contacts with the substrate, and thereafter curring the metal layers to expose portions of the major surface corresponding to the predetermined shapes of the detector marks.

14. A method of precisely aligning an electron beam with selected areas of a major surface of a substrate as set forth in claim 10 wherein:

the detector marks are formed by applying spaced apart metal layers to the major surface of the substrate to form Schottky barrier contacts with the substrate, applying an oxide layer over each metal layer to mask the metal layer against electron induced conductivity, and then cutting through each oxide layer to expose portions of each metal layer of shape corresponding to the predetermined shape of the detector marks.

15. A method of precisely aligning an electron beam with selected areas of a major surface of a substrate as set forth in claim 10 wherein:

the detector marks are formed by applying spaced apart metal layers to the major surface of the substrate to form Schottky barriers with the substrate, and thereafter cutting in the metal layers the negative of the shape corresponding to the predetermined shape of the detector mark to form a mesa in each metal layer of shape corresponding to the desired detector marks.

16. A method of precisely aligning an electron beam with selected areas of a major surface of a substrate as set forth in claim 10 wherein:

the detector marks are formed by epitaxially growing a semiconductor layer on the substrate and thereafter applying a metal layer to the semiconductor layer to form the Schottky barrier contact therewith.

17. A method of precisely aligning an electron beam with selected areas of a major surface of a substrate as set forth in claim 10 wherein:

each detector mark is of substantially the same predetermined shape as the predetermined cross-sectional shape of a corresponding alignment beam portion.

18. Apparatus for selectively irradiating precisely located areas of a major surface of a substrate comprising:

A. a photocathode source for generating a patterned beam of electrons including at least one alignment beam portion of predetermined cross-sectional shape;

B. at least one detector mark formed by a Schottky barrier contact and corresponding to each alignment beam portion positioned adjacent a major surface of a substrate, each detector mark having a predetermined shape;

C. means for positioning the substrate with the major surface in spaced relation to the photocathode source generating the patterned electron beam;

D. means for applying a potential between the substrate and the photocathode source whereby electrons from the photocathode source are directed to and selectively irradiate portions of the major surface of the substrate;

E. electromagnetic means for directing the patterned beam of electrons from the photocathode source to irradiate selected portions of the major surface of the substrate close to the precisely located areas, and for directing each alignment beam portion to irradiate selected portions of the major surface close to the corresponding detector mark;

F. electrical means for producing an electrical signal corresponding to the area of each said detector mark irradiated by an alignment beam portion; and G. electrical means for moving the patterned beam of electrons relative to the substrate responsive to said electrical signal from the electrical means to cause the alignment beam portions to substantially align with the respective detector marks, whereby the patterned beam of electrons from the photocathode is located and oriented relative to the substrate so that precisely located areas of the major surface of the substrate can be selectively irradiated with the patterned electron beam.

19. Apparatus for selectively irradiating precisely located areas of a major surface of a substrate as set forth in claim 18 wherein:

the patterned beam of electrons generated by the photocathode source includes at least one relatively widely spaced apart alignment beam portions of predetermined cross-sectional shapes.

20. Apparatus for selectively irradiating precisely located areas of a major surface of a substrate as set forth in claim 19 wherein:

the electrical means includes modulation means for oscillating the movement of each alignment beam portion over the corresponding detector mark, phase detection means for detecting along orthogonal axis the error from alignment of the alignment beam portions and the contacts and outputting an electrical signal corresponding thereo, and actuating means for changing the electrical input to the electromagnetic means responsive to the electrical signal from the phase detector means to bring the alignment beam portions and the marks into alignment.

21. Apparatus for selectively irradiating precisely located areas of a major surface of a substrate as set forth in claim 18 wherein:

the patterned beam of electrons generated by the photocathode source includes at least two spaced apart alignment beam portions having predetermined cross-sectional shapes substantially the same as the predetermined shapes of the corresponding detector marks.

* * * * *